(12) United States Patent
Yoo et al.

(10) Patent No.: US 8,894,240 B2
(45) Date of Patent: Nov. 25, 2014

(54) ILLUMINATION DEVICE

(71) Applicant: Samsung Electronics Co., Ltd., Gyeonggi-do (KR)

(72) Inventors: Cheol Jun Yoo, Chungcheongnam-do (KR); Young Hee Song, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/744,066

(22) Filed: Jan. 17, 2013

(65) Prior Publication Data

US 2013/0182432 A1    Jul. 18, 2013

(30) Foreign Application Priority Data

Jan. 18, 2012    (KR) .................. 10-2012-0005801

(51) Int. Cl.

| F21V 7/22 | (2006.01) |
|---|---|
| *F21V 19/00* | (2006.01) |
| *F21V 7/04* | (2006.01) |
| *F21K 99/00* | (2010.01) |
| *F21V 13/02* | (2006.01) |
| *F21V 7/10* | (2006.01) |
| F21Y 111/00 | (2006.01) |
| F21V 3/04 | (2006.01) |
| H01L 25/075 | (2006.01) |
| H01L 33/54 | (2010.01) |
| F21Y 101/02 | (2006.01) |

(52) U.S. Cl.

CPC ......... *F21V 7/10* (2013.01); *H01L 2224/48227* (2013.01); *F21Y 2111/001* (2013.01); *F21V 3/0418* (2013.01); *F21V 7/22* (2013.01); *H01L 25/0756* (2013.01); *F21V 19/001* (2013.01); *F21V 7/04* (2013.01); *F21K 9/50* (2013.01); *H01L 2224/73265* (2013.01); *H01L 33/54* (2013.01); *H01L 2224/32225* (2013.01); *F21K 9/30* (2013.01); *F21Y 2101/02* (2013.01); *F21V 7/048* (2013.01); *H01L 2224/48095* (2013.01); *H01L 2224/48465* (2013.01); *F21V 13/02* (2013.01); *F21V 3/0436* (2013.01)

USPC .................. 362/256; 362/255; 362/296.07

(58) Field of Classification Search

CPC ....... F21V 17/04; F21V 17/12; F21V 19/006; F21V 7/0066; F21V 7/09; F21V 7/0025; F21K 9/10; F21K 9/13; F21K 9/30; F21K 9/135; F21Y 2101/00; H01R 33/22

USPC ............... 362/241, 249.02, 255, 256, 296.07, 362/298, 311.02, 649, 650, 217.07

See application file for complete search history.

(56) References Cited

U.S. PATENT DOCUMENTS

| 2,138,373 | A | * | 11/1938 | Doane ..................... 362/296.07 |
|---|---|---|---|---|
| 7,960,872 | B1 | * | 6/2011 | Zhai et al. ..................... 362/298 |
| 8,545,052 | B2 | * | 10/2013 | Hu ............................ 362/249.02 |
| 2005/0243552 | A1 | * | 11/2005 | Maxik ....................... 362/249.02 |
| 2006/0193130 | A1 | * | 8/2006 | Ishibashi .................. 362/249.02 |
| 2008/0128739 | A1 | * | 6/2008 | Sanpei et al. ................. 362/294 |
| 2011/0215696 | A1 | * | 9/2011 | Tong et al. .................... 362/650 |
| 2013/0279164 | A1 | * | 10/2013 | Hsu ........................... 362/249.02 |

FOREIGN PATENT DOCUMENTS

| JP | 07-176791 A | 7/1995 |
|---|---|---|
| JP | 4088932 B2 | 5/2008 |
| KR | 20070097952 A | 10/2007 |

* cited by examiner

*Primary Examiner* — Y M Lee

(74) *Attorney, Agent, or Firm* — McDermott Will & Emery LLP

(57) ABSTRACT

An illumination device includes a main body unit, a light source module and a cover unit. The light source module is disposed in an upper space of the main body unit to be separated therefrom and includes a substrate and at least one light emitting device respectively disposed on both surfaces of the substrate. The cover unit is disposed on the main body unit to cover the light source module and allowing light emitted from the light source module to be emitted from a surface of the cover unit in a radial manner.

20 Claims, 14 Drawing Sheets

ILLUMINATION DEVICE

CROSS-REFERENCE TO RELATED APPLICATION

This application claims benefit of priority of Korean Patent Application No. 10-2012-0005801 filed on Jan. 18, 2012, in the Korean Intellectual Property Office, the entire contents of which are hereby incorporated by reference.

TECHNICAL FIELD

The present inventive concept relates to an illumination device.

BACKGROUND

A light emitting diode (LED) is a type of light emitting device capable of implementing light of various colors by utilizing various compound semiconductor materials such as GaAs, AlGaAs, GaN, InGaP, or the like.

Since LEDs have several advantages such as excellent monochromic peak wavelengths, excellent optical efficiency, compactness, environmental friendliness, low power consumption, and the like, they have commonly been applied to various devices such as TVs, computers, illumination devices, automobiles, and the like.

Recently, energy reduction initiatives have regulated the use of incandescent electric lamps, which are low-efficiency illumination devices. Thus, the replacement of incandescent electric lamps with high-efficiency illumination devices, such as an LED light emitting device, has been actively undertaken by light emitting device manufacturers and general illumination device manufacturers.

However, with a light emitting device, it is difficult to provide illumination having radiation characteristics similar to the light distribution characteristics of incandescent electric lamps, in terms of luminescent properties and a heat dissipation structure. Thus, recently developed light emitting device lamps do not have a wide light distribution angle due to the structural characteristics of the light emitting device in which light is only emitted from one side. Even when the shape of existing incandescent lamps is retained, illumination having a desired radiation form may not be realized.

In particular, an illumination area of a light emitting device lamp is small and the reverse side of a lamp cover, which is not illuminated, may be dark. Thus, research on a spherical light source having a radiation form such as that of an incandescent electric light bulb is under way.

SUMMARY

An aspect of the present inventive concept relates to an illumination device using a light emitting device as a light source and having lateral and rear sides thereof illuminated in a radial manner as well as a front side thereof, thus having excellent light distribution characteristics.

An aspect of the present inventive concept encompasses an illumination device including: a main body unit; a light source module disposed in an upper space of the main body unit to be separated therefrom and including a substrate and at least one light emitting device respectively disposed on both surfaces of the substrate; and a cover unit disposed on the main body unit to cover the light source module and allowing light emitted from the light source module to be emitted from a surface of the cover unit in a radial manner.

The substrate may be disposed to be parallel to the main body unit such that the at least one light emitting device respectively disposed on the both surfaces of the substrate emits light toward upper and lower sides of the substrate.

The substrate may be disposed to be perpendicular to the main body unit such that the at least one light emitting device respectively disposed on the both surfaces of the substrate emits light toward left and right sides of the substrate.

The illumination device may further include at least one support unit disposed on the main body unit and supporting the light source module disposed in the upper space of the main body unit.

The at least one support unit may include a body having a pillar shape, and the body may have a sectional area smaller than a sectional area of the main body unit.

The body may include a material having high thermal conductivity. The body may have an inner hole formed therein, the inner hole accommodating an electric wire electrically connected to the light source module.

The at least one support unit may further include a reflective layer disposed on an outer surface of the body.

The at least one support unit may form a space accommodating the at least one light emitting device disposed on one surface of the substrate facing the main body unit.

The at least one support unit may allow power to be supplied from the main body unit connected to an external power source to the light source module.

The illumination device may further include a reflective unit disposed on the main body unit between the main body unit and the light source module and reflecting the light emitted from the light source module toward the main body unit.

The reflective unit may protrude from a central portion thereof and include a reflective surface facing the light source module.

The reflective unit may further include a plurality of through holes allowing the light emitted from the light source module to pass therethrough.

The plurality of through holes may be formed in a region between a periphery of the reflective unit and a region in which the light emitted from the light source module traverses an upper edge of the main body unit.

The substrate may include a core plate having the at least one light emitting device fixedly attached thereto, and an insulating layer covering the core plate.

The core plate may include a plurality of divided members having electrical conductivity and insulated from each other by the insulating layer.

The core plate may include a pair of core plates disposed within the insulating layer and stacked on each other, while having a predetermined interval therebetween due to the insulating layer.

The insulating layer may include an opening exposing a portion of the core plate for connecting the core plate to the at least one light emitting device.

The core plate may include a non-conductive material having light transmittance. The core plate may have an electrode layer on both surfaces thereof, the electrode layer being disposed between the core plate and the insulating layer and electrically connected to the at least one light emitting device.

The electrode layer may include a transparent electrode layer formed of at least one of ITO, carbon nanotubes (CNTs), and graphene, and at least one pair of electrode layers may be disposed on the both surfaces of the core plate.

The insulating layer may include an opening exposing a portion of the electrode layer for connecting the electrode layer to the at least one light emitting device.

The light source module may further include a lens unit covering the at least one light emitting device on the both surfaces of the substrate.

Another aspect of the present inventive concept relates to an illumination device including: a main body unit; a light source module disposed in an upper space of the main body unit and including a substrate and at least one light emitting device respectively disposed on both surfaces of the substrate; and a reflective unit disposed on the main body unit between the main body unit and the light source module and reflecting the light emitted from the light source module toward the main body unit.

The illumination device may further includes a cover unit disposed on the main body unit to cover the light source module and allowing light emitted from the light source module to be emitted from a surface of the cover unit in a radial manner.

BRIEF DESCRIPTION OF THE DRAWINGS

The foregoing and other features of the inventive concept will be apparent from more particular description of embodiments of the inventive concept, as illustrated in the accompanying drawings in which like reference characters may refer to the same or similar parts throughout the different views. The drawings are not necessarily to scale, emphasis instead being placed upon illustrating the principles of the embodiments of the inventive concept. In the drawings, the thickness of layers and regions may be exaggerated for clarity.

DETAILED DESCRIPTION OF THE EMBODIMENTS

Figure 1:
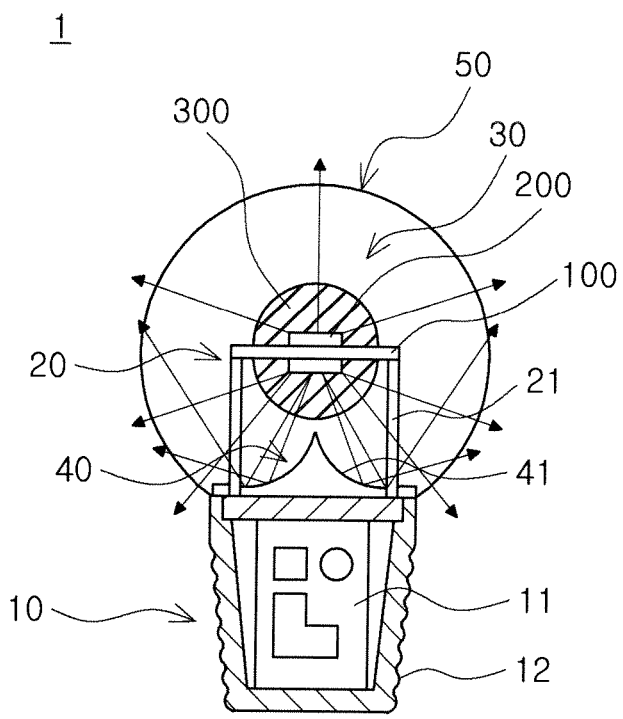
FIG. 1 is a view schematically illustrating an illumination device including a support unit, a reflective unit and a light source module, according to an embodiment of the present inventive concept.

Examples of the present inventive concept will be described below in more detail with reference to the accompanying drawings. The examples of the present inventive concept may, however, be embodied in different forms and should not be construed as limited to the examples set forth herein. Like reference numerals may refer to like elements throughout the specification.

Hereinafter, referring to the drawings, the examples of the present inventive concept will be described in further detail.

An illumination device according to an embodiment of the present inventive concept will be described with reference to FIGS. 1 through 5C.

Figure 2:
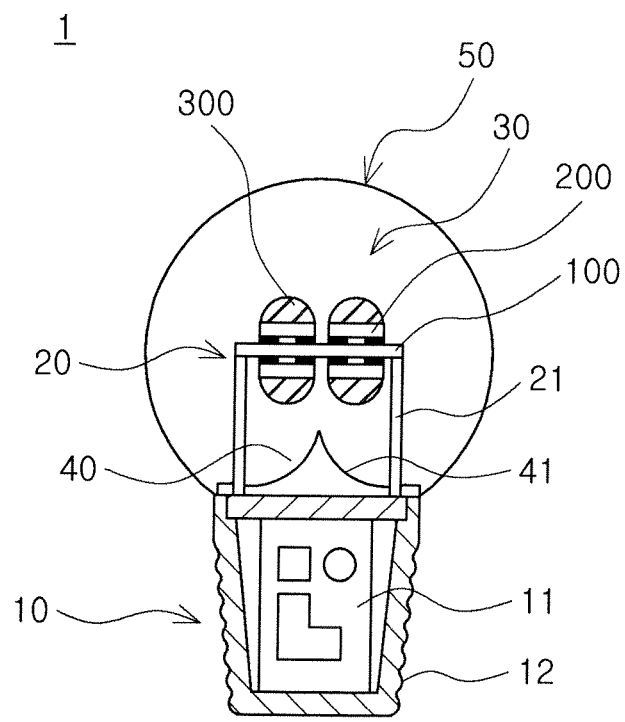
FIG. 2 is a view schematically illustrating a modification of the illumination device of FIG. 1.
Figure 3:
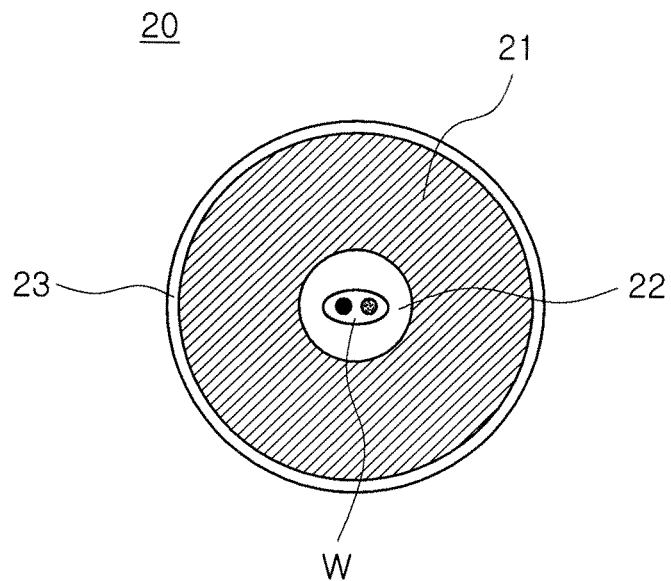
FIG. 3 is a schematic cross-sectional view of the support unit of FIG. 1.
Figure 4:
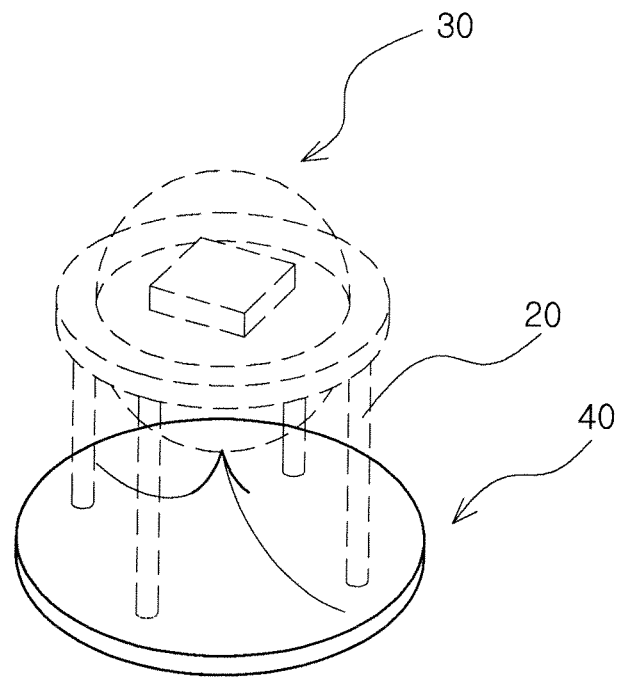
FIG. 4 is a schematic view of the reflective unit of FIG. 1.
Figure 5A:
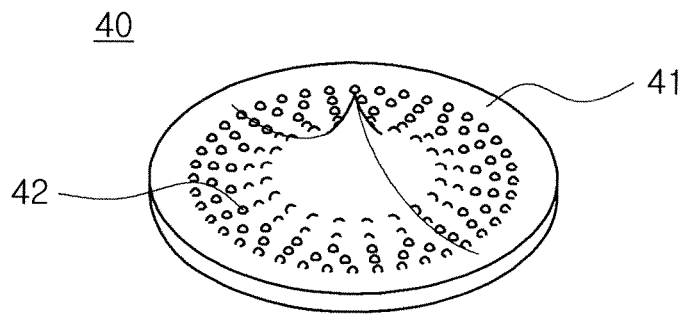
FIGS. 5A through 5C are views schematically illustrating various examples of the reflective unit of FIG. 4.
Figure 5B:
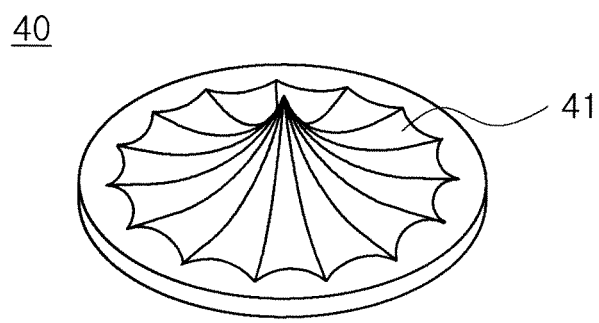
Figure 5C:
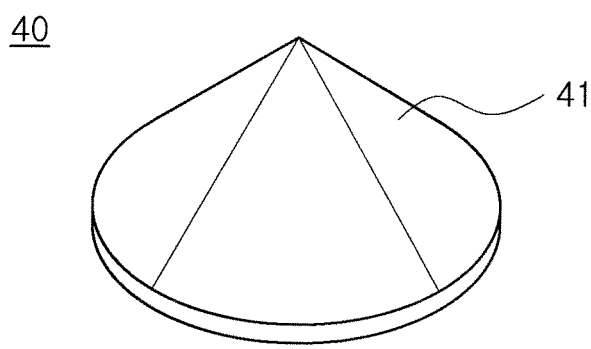

FIG. 1 is a view schematically illustrating an illumination device including a support unit, a reflective unit and a light source module, according to an embodiment of the present inventive concept; FIG. 2 is a view schematically illustrating a modification of the illumination device of FIG. 1; FIG. 3 is a schematic cross-sectional view of the support unit of FIG. 1; FIG. 4 is a schematic view of the reflective unit of FIG. 1; and FIGS. 5A through 5C are views schematically illustrating various examples of the reflective unit of FIG. 4.

With reference to FIGS. 1 and 2, an illumination device 1 according to an embodiment of the present inventive concept includes a main body unit 10, a support unit 20, and a light source module 30. The illumination device 1 may further include a reflective unit 40 and a cover unit 50.

The main body unit 10 serves as a housing member supporting the support unit 20 and the light source module 30, and dissipates heat generated from the light source module 30 to the outside. The main body unit 10 may be formed of a metallic material having excellent thermal conductivity or a plastic material such as a heat dissipation resin.

A power supply unit (e.g., a switched-mode power supply (SMPS)) 11 is provided in the main body unit 10 to supply power to the light source module 30. An external connection unit 12 is provided in a lower portion of the main body unit 10 and connected to an external power source (not separately shown).

At least one support unit 20 may be disposed on the main body unit 10 to support the light source module 30. The support unit 20 may have a sectional area smaller than a sectional area of the main body unit. Specifically, the support unit 20 may allow the light source module 30 to be spaced apart from the main body unit 10 and disposed above the main body unit 10 with a predetermined height therebetween. The support unit 20 allows power to be supplied from the main body unit 10 connected to the external power source to the light source module 30.

The support unit 20 may have a pillar-shaped body 21 having a predetermined length and an inner hole 22 penetrating the body 21 in a lengthwise direction thereof as shown in FIG. 3. The body 21 has a cylindrical shape as shown in FIG. 4; however, the shape of the body 21 is not limited thereto. The body 21 may have various pillar shapes such as a square pillar or the like.

The support unit 20 may be formed of a material having high thermal conductivity, such that it may serve as a path for dissipating heat generated at the time of the operation of the light source module 30.

The support unit 20 may have a reflective layer (see FIG. 3) formed on an outer surface of the body 21. The reflective layer 23 may be formed of a high reflectivity material. For example, the reflective layer 23 may be formed by the application or coating of a metallic material such as aluminum or the like, or a resin containing $TiO_2$. Further, the reflective layer 23 may be attached to the outer surface of the body 21 in the form of a thin film. The reflective layer 23 allows light emitted from the light source module 30 to be reflected, without being absorbed by the support unit 20, whereby light emission efficiency may be improved.

Referring to FIG. 3, the inner hole 22 may be formed to penetrate the body 21 of the support unit 20 in a lengthwise direction (e.g., height direction) thereof. The inner hole 22 has an electrical wire w accommodated therein, the electric wire w being electrically connected to the light source module 30. Specifically, the inner hole 22 has the electrical wire w accommodated therein so as to supply power from the power supply unit 11 of the main body unit 10 to the light source module 30, such that the power supply unit 11 and the light source module 30 may be electrically connected to each other.

The inner hole 22 may be filled with a low thermal conductivity material. In this case, the electrical wire w may be protected from heat generated in the light source module 30 and conducted through the support unit 20. Further, the inner hole 22 may contain air.

The light source module 30 may be spaced apart from the main body unit 10 and disposed above the main body unit 10 at a predetermined height therefrom, while being supported by the support unit 20, and may emit light in a radial manner. The light source module 30 may include a substrate 100 disposed on the support unit 20, and a plurality of light emitting devices respectively mounted on both surfaces of the substrate 100. The light source module 30 may further include a lens unit 300 covering the light emitting device 200.

The light emitting device 200 may include a light emitting diode (LED). An LED chip may be provided as shown in FIG. 1, or an LED chip package may be provided as shown in FIG. 2.

As shown in FIGS. 1 and 2, the substrate 100 may be disposed to be parallel to the main body unit 10. That is, the substrate 100 may be disposed on the support unit 20 while a lower surface of the substrate 100 is parallel to an upper surface of the main body unit 10. Therefore, the light emitting devices 200 mounted on both surfaces of the substrate 100 may emit light toward upper and lower sides of the substrate 100. In this case, the support unit 20 forms a space in which the light emitting device 200 mounted on the lower surface of the substrate 100 is accommodated. Therefore, the light emitting device 200 disposed on the lower surface of the substrate 100 may emit light downwardly from the upper side of the main body unit 10 toward the main body unit 10.

Meanwhile, a specific structure of the light source module 30 will be described in detail below.

The reflective unit 40 is disposed on the main body unit 10. The reflective unit 40 may be disposed between the light source module 30 and the main body unit 10 such that the reflective unit 40 reflects light emitted from the light source module 30 toward the main body unit 10.

As shown in FIGS. 1 and 4, the reflective unit 40 may have a conic shape in which a central portion thereof is protruded, and have a reflective surface 41 facing the light source module 30. The reflective surface 41 may be formed as a curved surface having a predetermined curvature. Further, as shown in FIG. 5A, the reflective surface 41 may have a plurality of protrusions 42 formed thereon. Alternatively, as shown in FIG. 5B, the reflective surface 41 may be formed to have a circus tent shape in which a plurality of divided regions are provided. Alternatively, the reflective surface 41 may have a flat inclined surface as shown in FIG. 5C.

The cover unit 50 is mounted on the main body unit 10 to cover and protect the light source module 30 and the support unit 20. The cover unit 50 may be formed of a material such as polycarbonate (PC), plastic, silica, acryl, glass, or the like. The cover unit 50 may be translucent to allow light transmitted therethrough to be uniform; however, the present inventive concept is not limited thereto.

The cover unit 50 may allow the light emitted from the light source module 30 to be uniformly emitted from an outer surface thereof in a radial manner, thereby realizing a spherical light source. Therefore, the illumination device 1 may have lateral and rear sides thereof illuminated in a radial manner as well as a front side thereof, thus having improved light distribution characteristics.

As described above, the illumination device according to the embodiment of the inventive concept allows light emitted toward the main body unit 10 from the light emitting device 200 mounted on the lower surface of the substrate 100 among the plurality of light emitting devices 200 of the light source module 30 to be partially reflected by the reflective unit 40 disposed between the light source module 30 and the main body unit 10, such that light emitted from the light emitting device 200 mounted on the upper surface of the substrate 100, light emitted from the light emitting device 200 mounted on the lower surface of the substrate 100, and light reflected by the reflective unit 40 may be mixed with each other. In this manner, light may be uniformly emitted from the entirety of the surface of the cover unit 50, whereby a spherical light source providing illumination at an increased light distribution angle in a radial manner similar to that of a conventional incandescent electric lamp may be realized.

An illumination device according to another embodiment of the present inventive concept will be described with reference to FIGS. 6 through 7B.

Figure 6:
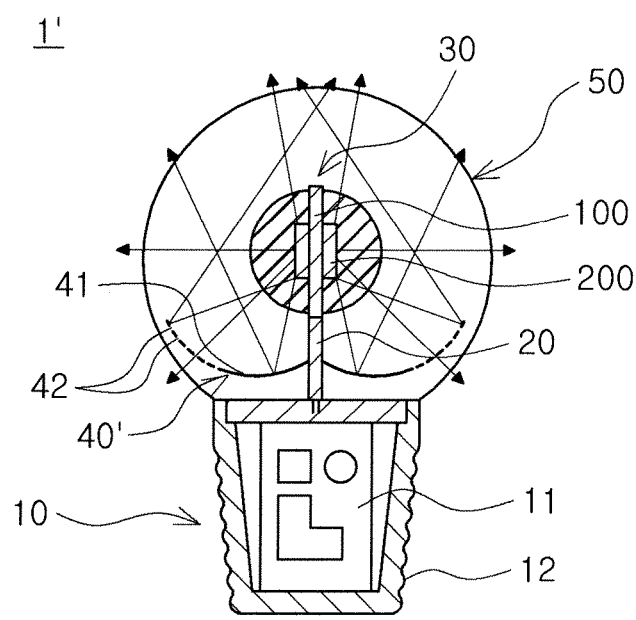
FIG. 6 is a view schematically illustrating an illumination device including a reflective unit, according to another embodiment of the present inventive concept.
Figure 7A:
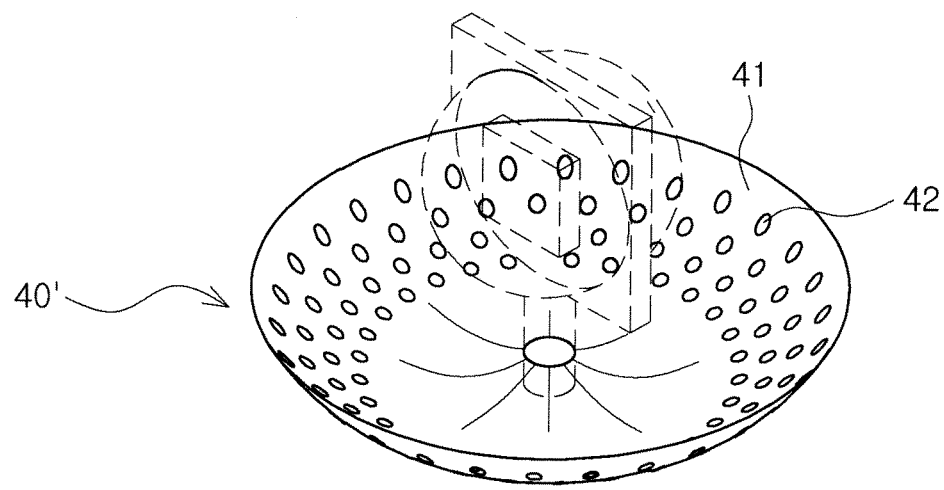
FIGS. 7A and 7B are schematic views of the reflective unit of FIG. 6.
Figure 7B:
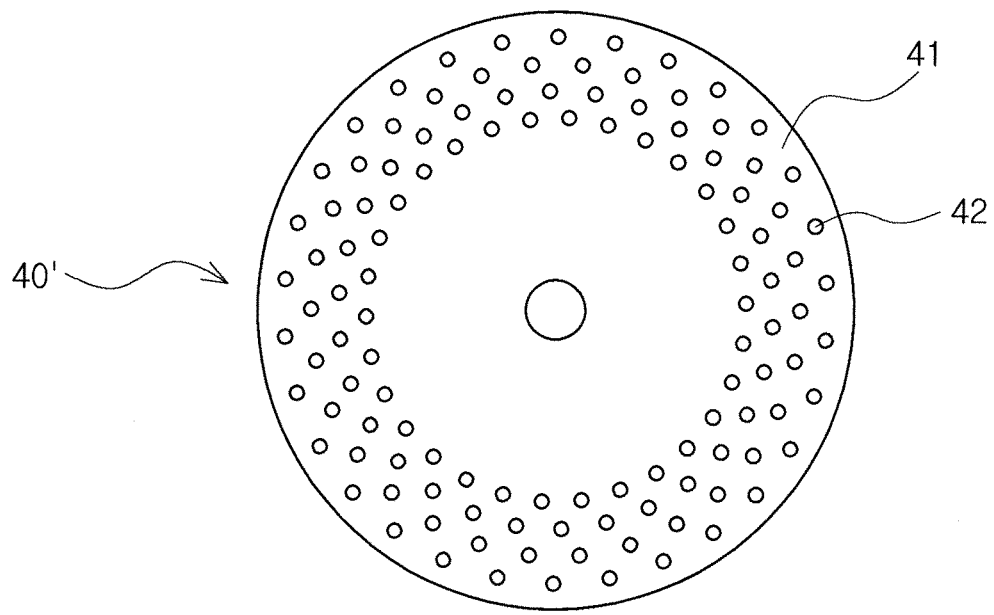

The basic structure of an illumination device 1' according to the embodiment shown in FIGS. 6 through 7B is substantially identical to the basic structure of the illumination device 1 according to the embodiment shown in FIGS. 1 through 5C, except that a light source module is mounted in a different manner and a reflective unit has a different structure. Accordingly, a repeated description thereof will be omitted and the different structural features of the light source module and the reflective unit will primarily be described in detail.

FIG. 6 is a view schematically illustrating the illumination device including a reflective unit according to another embodiment of the present inventive concept; and FIGS. 7A and 7B are schematic views of the reflective unit of FIG. 6.

As illustrated, the substrate 100 is mounted to be perpendicular to the main body unit 10 using the support unit 20. In this case, the light emitting devices 200 respectively mounted on both surfaces of the substrate 100 emit light to the left and right sides of the substrate 100.

The substrate 100 is supported on the main body unit 10 by the support unit 20 in FIG. 6; however, the substrate 100 may be directly mounted on the main body unit 10. In this case, the support unit 20 may be omitted.

A reflective unit 40' may be disposed between the main body unit 10 and the light source module 30, and the reflective surface 41 may be concave to enclose the light emitting devices 200 respectively mounted on both surfaces of the substrate 100.

The reflective surface 41 includes the plurality of through holes 42 allowing the light emitted from the light source module 30 to pass therethrough. The plurality of through holes 42 may be formed in a region between the periphery of the reflective unit 40' and a region in which the light emitted from the light source module 30 traverses an upper edge of the main body unit 10. Therefore, the light emitted from the light source module 30 may be partially reflected by the reflective surface and may partially pass through the through holes to thereby irradiate the rear side of the reflective surface. In this manner, the rear side of the illumination device 1', in which the main body unit 10 is disposed, as well as the front and lateral sides thereof may be uniformly irradiated with light. Thus, a spherical light source providing illumination at an increased light distribution angle in a radial manner, similar to that of a conventional incandescent electric lamp, may be realized.

An illumination device according to another embodiment of the present inventive concept will be described with reference to FIGS. 8 and 16C.

Figure 8:
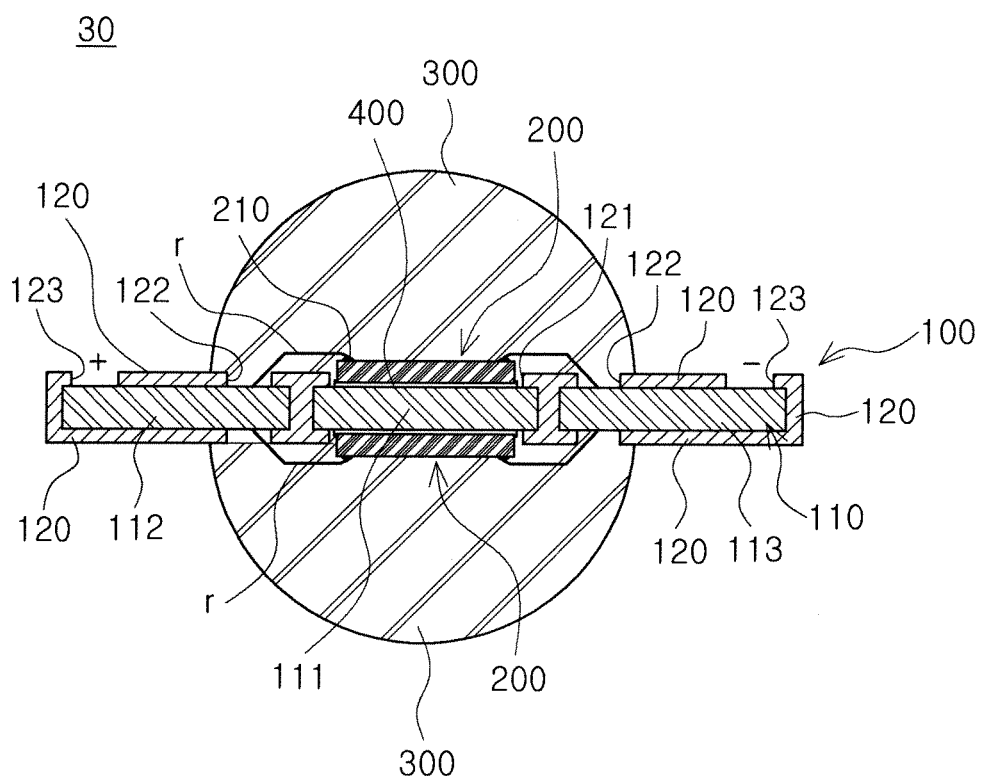
FIG. 8 is a schematic view of the light source module of FIG. 1, including a core plate forming a substrate and an opening for connecting the core plate to an external power source.
Figure 9A:
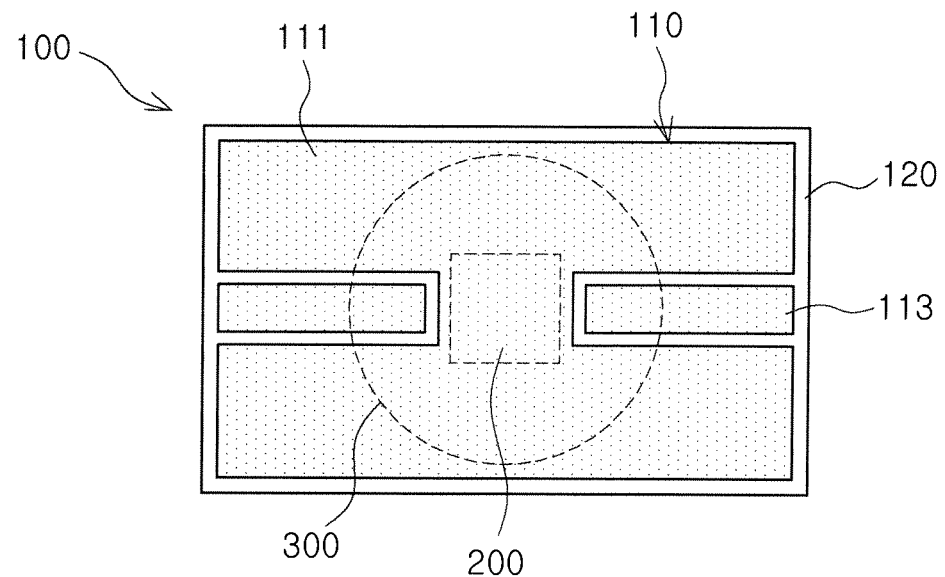
FIG. 9A is a schematic view of the core plate in the light source module of FIG. 8, including an insulating layer having openings.
Figure 9B:
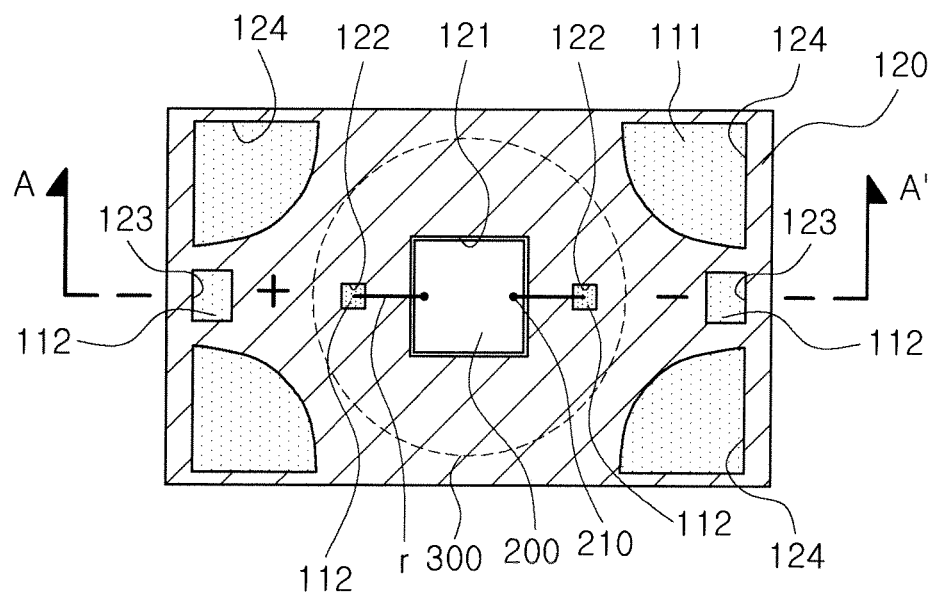
FIG. 9B is a schematic view of the insulating layer shown in FIG. 9A.

FIG. 8 is a schematic view of the light source module of FIG. 1, including a core plate forming a substrate and an opening for connecting the core plate to an external power source; FIG. 9A is a schematic view of the core plate in the light source module of FIG. 8; and FIG. 9B is a schematic view of an insulating layer having openings shown in FIG. 9A.

Figure 10A:
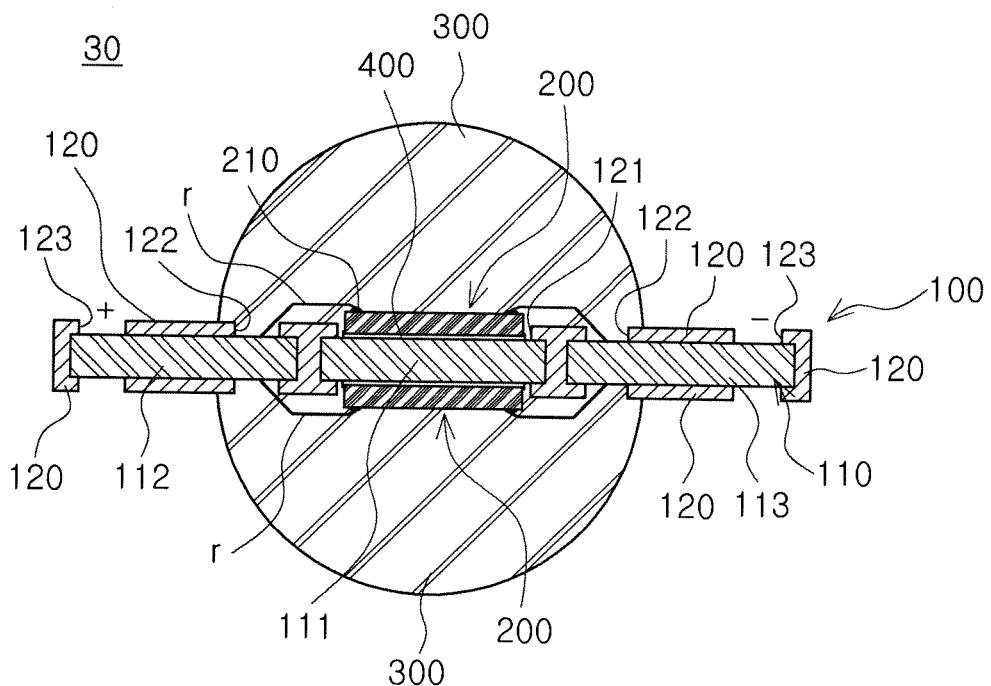
FIGS. 10A and 10B are views schematically illustrating modifications of the opening of FIG. 8.
Figure 10B:
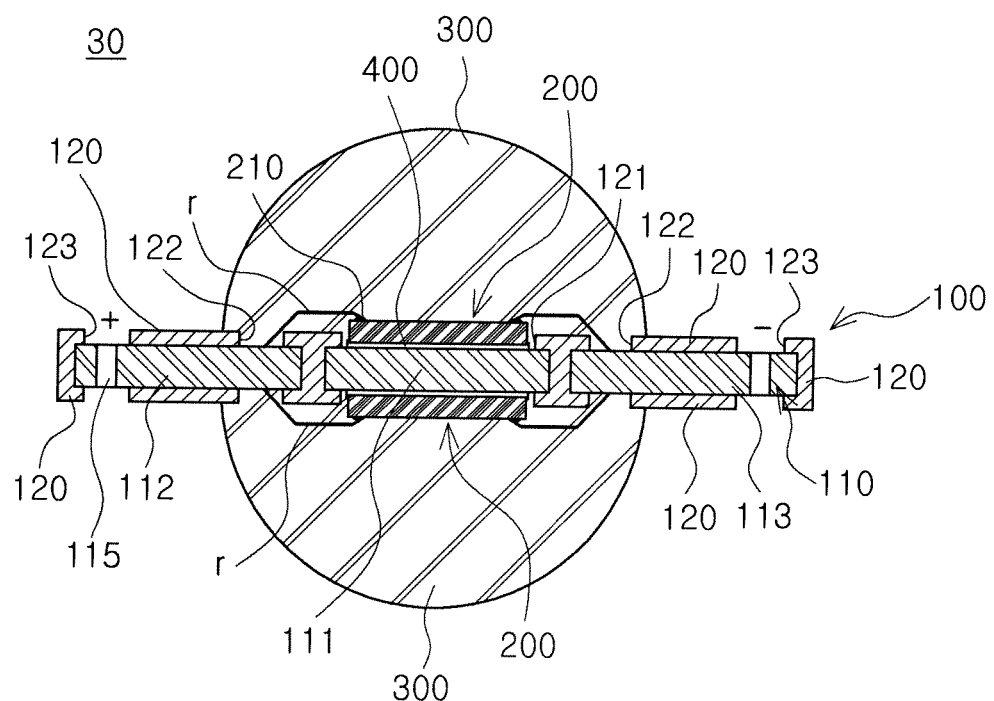
Figure 11:
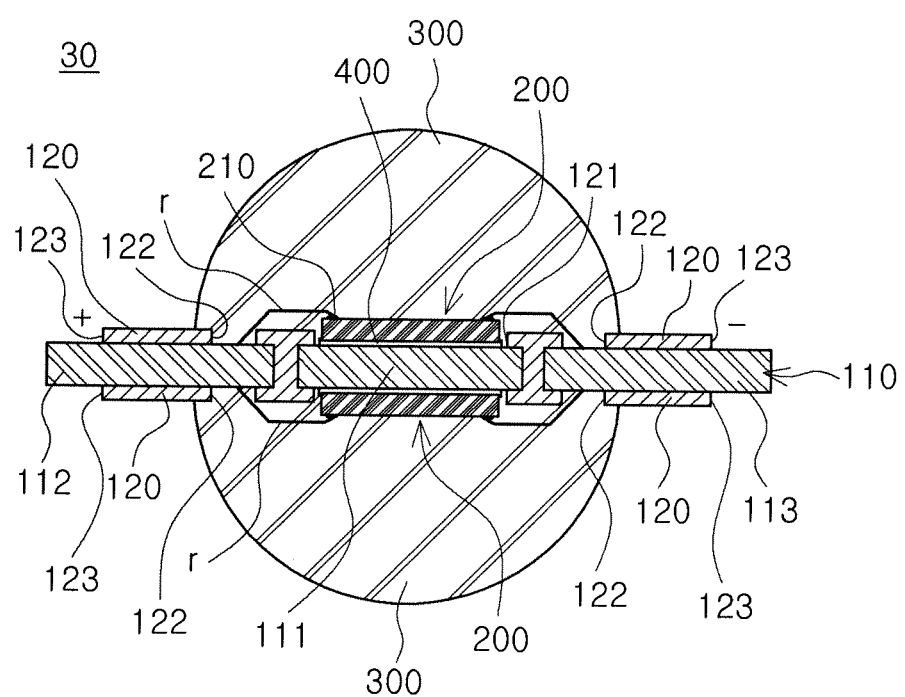
FIG. 11 is a view schematically illustrating another example of the opening of FIG. 8.

FIGS. 10A and 10B are views schematically illustrating modifications of the opening of FIG. 8; and FIG. 11 is a view schematically illustrating another example of the opening of FIG. 8.

As shown in FIG. 8, the light source module 30 includes the substrate 100 mounted on the support unit 20, and the plurality of light emitting devices 200 respectively mounted on both surfaces of the substrate 100. The light source module 30 may further include a lens unit 300 covering the light emitting devices 200.

The light emitting device 200 may be a semiconductor device able to emit light having a predetermined wavelength when external power is applied thereto. The light emitting device 200 may include a light emitting diode (LED). The light emitting device 200 may emit blue, red or green light according to a material contained therein, and may also produce white light.

The light emitting device 200 may include an LED chip or an LED chip package. The light emitting device 200 may include a plurality of LED chips or a multi-chip package (MCP) in which a plurality of LED chips are mounted. In this case, the plurality of light emitting devices 200 may be arrayed in a matrix form, and may be homogeneous light emitting devices emitting light having the same wavelength, or heterogeneous light emitting devices emitting light having different wavelengths.

Referring to FIG. 8, the substrate 100 may include a core plate 110 having the light emitting devices 200 fixedly attached to both surfaces thereof, and an insulating layer 120 covering the core plate 110.

The core plate 110 may be formed of a metal and a metallic compound having electrical conductivity. The core plate 110 has a plurality of divided members. In this case, the individual divided members are electrically insulated from each other by the insulating layer 120.

As shown in FIGS. 8 through 9B, the core plate 110 may include three divided members 111, 112 and 113. The divided member 111 may be disposed in the center of the three divided members, and may have the light emitting devices 200 mounted thereon, and two divided members 112 and 113 disposed on the left and right sides of the light emitting devices 200 may be connected to positive (+) and negative (−) electrodes, respectively. The light emitting devices 200 may be disposed on both surfaces of the divided member 111. In this case, the number of the light emitting devices 200 disposed on both surfaces of the divided member 111 may be equal or unequal. The light emitting devices 200 may be fixedly attached to both surfaces of the divided member 111 using an adhesive 400 (see FIG. 8) having electrical insulation and thermal conductivity properties.

The divided members 111, 112 and 113 may be electrically insulated from each other by the insulating layer 120. The light emitting devices 200 may be electrically connected to the left and right divided members 112 and 113 via a bonding wire r. As illustrated, the three divided members 111, 112 and 113 are provided as an example; however, the present inventive concept is not limited thereto. A single or a pair of divided members may be provided. Alternatively, four or more divided members may be provided.

Referring to FIG. 8, the insulating layer 120 may be a solder resist and cover the core plate 110, in particular, the divided members 111, 112 and 113 of the core plate 110. As illustrated, the insulating layer 120 may be applied to the entirety of the core plate 110 including the upper and lower surfaces and periphery of the core plate 110.

The insulating layer 120 may be formed of a white material having properties of high light reflectivity and high heat resistance. For example, the insulating layer 120 may be formed by adding $TiO_2$ to a high heat-resistant epoxy or silicon resin having high heat resistance in order to produce white light. Further, in order to secure flame resistance and superior mechanical properties, an inorganic filling material such as silica, alumina or the like may be added to the high heat-resistant epoxy or silicon resin. Alternatively, the insulating layer 120 may be formed by sintering a ceramic material on the core plate 110, thereby improving the rigidity of the substrate 100.

The insulating layer 120 has openings exposing portions of the core plate 110. The openings may include a region for mounting the light emitting devices 200 on the core plate 110, a region for an electrical connection between the core plate 110 and the light emitting devices 200, and a region for an electrical connection between the core plate 110 and an external power source, namely, the power supply unit 11.

As illustrated, an opening 121 defining a region for mounting the light emitting device 200 may be disposed on the central divided member 111, while having a shape corresponding to a shape of the light emitting device 200. In another embodiment, the opening 121 allowing for the mounting of the light emitting device 200 on the core plate may be omitted. That is, the light emitting device 200 may be mounted on the insulating layer 120 without the opening 121. However, in order to enhance heat dissipation, the opening 121 may be formed and the light emitting device 200 may be directly formed on the core plate 110 exposed through the opening 121.

An opening 122 defining a region for an electrical connection between the core plate 110 and the light emitting devices 200 may be formed in the divided members 112 and 113 connected to the positive (+) and negative (−) electrodes, respectively. The opening 122 may allow the light emitting devices 200 and the core plate 110 to be electrically connected via the bonding wire r.

As shown in FIGS. 9A and 9B, electrode pads 210 are provided on upper surfaces of the light emitting devices 200, that is, surfaces opposed to a contact surface between the light emitting devices 200 and the core plate 110, thereby allowing the light emitting devices 200 to be electrically connected to the core plate 110 via the bonding wire r. The electrode pad structure is not limited thereto. The electrode pads may be provided on lower surfaces of the light emitting devices 200, as will be described below.

An opening 123 defining a region for an electrical connection between the core plate 110 and the external power source may be formed in the divided members 112 and 113 connected to the positive (+) and negative (−) electrodes, respectively. Specifically, the opening 123 allows the electrical wire w accommodated in an inner hole of the support unit 20 to be electrically connected to the divided members 112 and 113 exposed therethrough. Thus, power is supplied from the power supply unit 11 to the light emitting devices 200. The opening 123 may be close to the opening 122 for wire bonding, while the opening 123 may be closer to the periphery of the core plate 110 as compared with the opening 122. That is, the opening 122 for wire bonding may be close to the light emitting devices 200 disposed in the central portion of the core plate 110, while the opening 123 for the electrical connection between the core plate 110 and the external power source may be close to the periphery of the core plate 110.

As shown in FIG. 8, the opening 123 for connection with the external power source may be formed in the insulating layer 120 on either surface of the core plate 110. Alternatively, as shown in FIG. 10A, the opening 123 may be formed in the insulating layer 120 on both surfaces of the core plate 110. Further, a through hole 115 may be formed in a portion of the core plate 110 exposed through the opening 123 as shown in FIG. 10B.

Meanwhile, a region for rapidly dissipating heat generated in the light emitting devices 200 outwardly may be further provided. In FIG. 9B, an opening 124 defining a region for heat dissipation may be provided at respective corners of the core plate 110; however, the present inventive concept is not limited thereto. The opening 124 may serve to directly dissipate heat conducted to the core plate 110 outwardly, or be connected to a heat dissipation device (not separately shown) to thereby rapidly dissipate heat from the core plate 110 outwardly.

These openings 121, 122, 123 and 124 may be formed in the insulating layer 120 on both surfaces of the core plate 110. The openings 121, 122, 123 and 124 may be symmetrically disposed with regard to one another on both surfaces of the core plate 110; however, the present inventive concept is not limited thereto.

FIG. 11 is a view schematically illustrating another example of the opening 123 for connecting a core plate to an external power source. As shown in FIG. 11, the opening 123 may be formed to allow end portions of the core plate 110 to be protruded from the insulating layer 120 and be exposed outwardly.

Figure 12A:
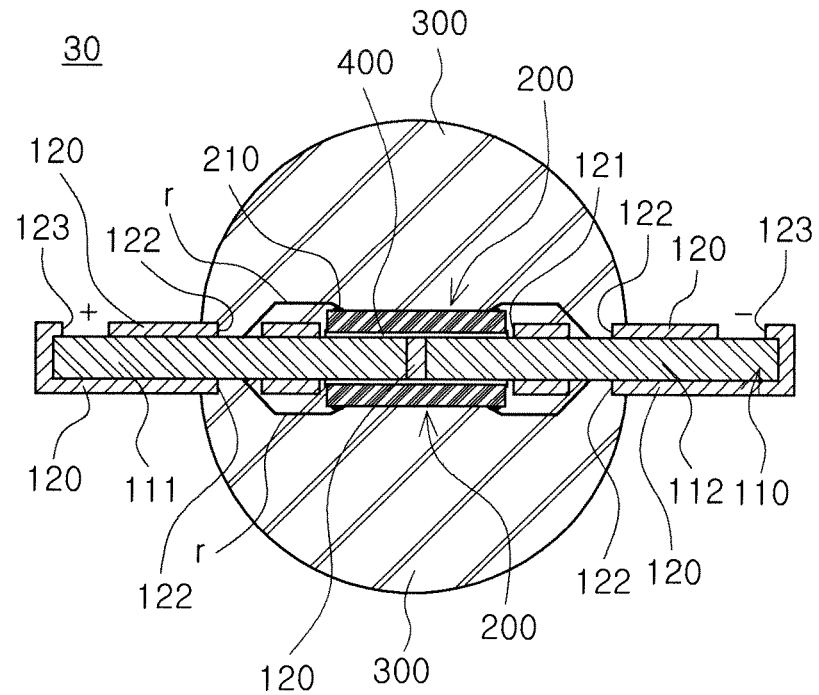
FIGS. 12A and 12B are views schematically illustrating modifications of the core plate of FIG. 8.
Figure 12B:
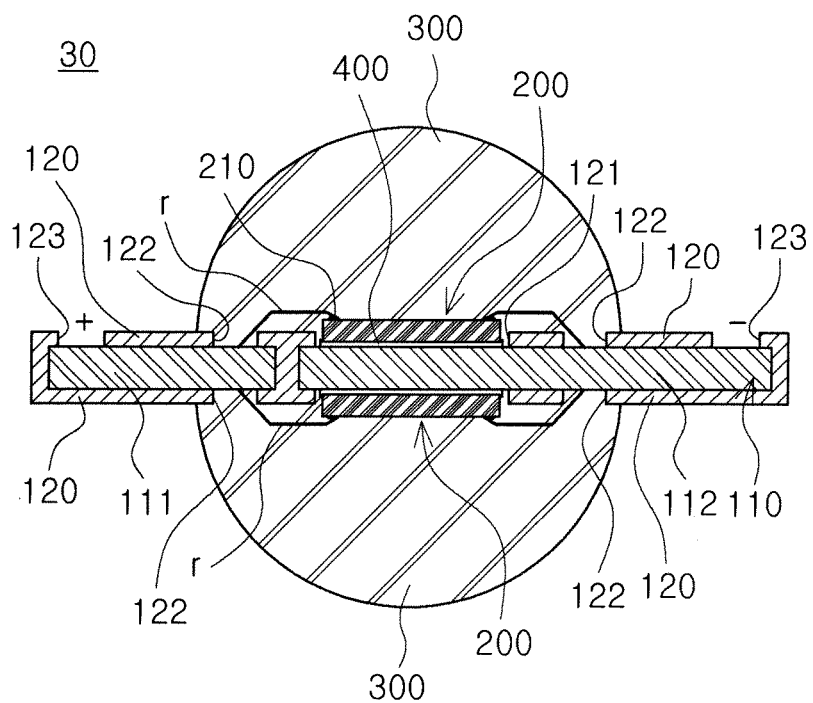

FIGS. 12A and 12B are views schematically illustrating modifications of the core plate 110. As illustrated, the core plate 110 may include two divided members 111 and 112. In this case, the two divided members 111 and 112 may be connected to positive (+) and negative (−) electrodes, respectively.

As shown in FIG. 12A, the two divided members 111 and 112 may have a symmetrical structure, and the light emitting devices 200 may be respectively disposed on both surfaces of the core plate 110 while making a connection between the two divided members 111 and 112. The light emitting devices 200 may be fixedly attached to the core plate 110 using the adhesive 400 having electrical insulation and thermal conductivity properties.

The light emitting devices 200 may be electrically connected to the core plate 110 exposed through the opening 121 formed in the insulating layer 120, in particular, the divided members 111 and 112 respectively connected to the positive (+) and negative (−) electrodes.

As shown in FIG. 12B, the divided members 111 and 112 may have an asymmetrical structure in which one divided member is longer than the other. In this case, the light emitting devices 200 may be fixed to the longer divided member 112.

Figure 13A:
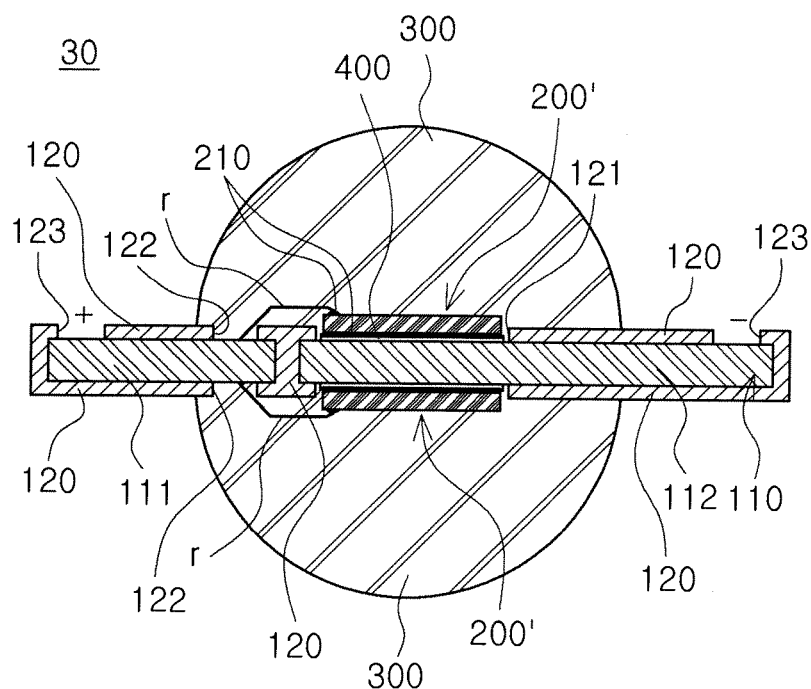
FIGS. 13A and 13B are views schematically illustrating modifications of the light emitting device of FIG. 8.
Figure 13B:
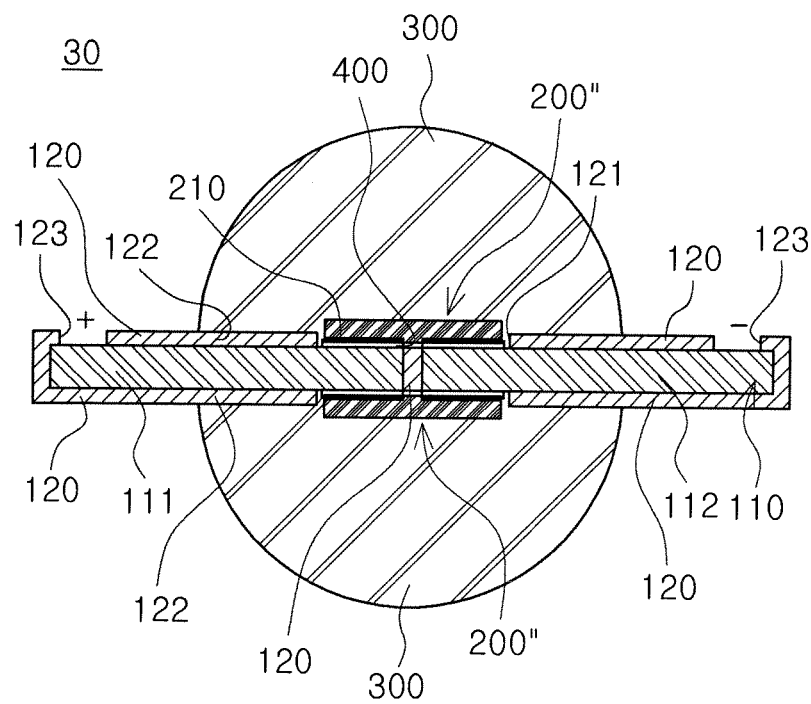

FIGS. 13A and 13B are views schematically illustrating modifications of the light emitting devices.

As shown in FIG. 13A, light emitting devices 200' may have the electrode pads 210 on upper and lower surfaces thereof. Specifically, the light emitting devices 200 have the electrode pads 210 on upper surfaces thereof in FIGS. 12A and 12B, while the light emitting devices 200' have the electrode pads 210 on the upper and lower surfaces thereof in FIG. 13A. In this case, the electrode pad 210 disposed on the lower surface of the light emitting device 200' may be attached to the core plate 110 using the conductive adhesive 400 to thereby be electrically connected thereto, while the electrode pad 210 disposed on the upper surface of the light emitting device 200' may be connected to the core plate 110 via the bonding wire r.

As shown in FIG. 13B, light emitting devices 200" may have the electrode pads 210 on lower surfaces thereof in contact with the core plate 110. In this case, the insulating layer 120 may have the opening 121 for mounting the light emitting device 200", on end portions of the divided members 111 and 112 of the core plate 110, facing each other. The light emitting device 200" may be attached to the divided members 111 and 112 extended inwardly of the opening 121 and exposed through the opening 121 using the conductive adhesive 400, such that the light emitting devices 200 and the divided members are electrically connected to each other. The conductive adhesive 400 may include a solder bump.

The lens unit 300 may protect the light emitting devices 200 mounted on both surfaces of the substrate 100 (see FIGS. 10A and 10B) and be disposed to maintain an orientation angle of light. The lens unit 300 may be formed of a light transmissive resin. The lens unit 300 may include a phosphor material converting a wavelength of the light emitted from the light emitting devices 200 into a wavelength of a desired color of light.

A light source module according to another embodiment of the present inventive concept will be described with reference to FIGS. 14A and 14B.

Figure 14A:
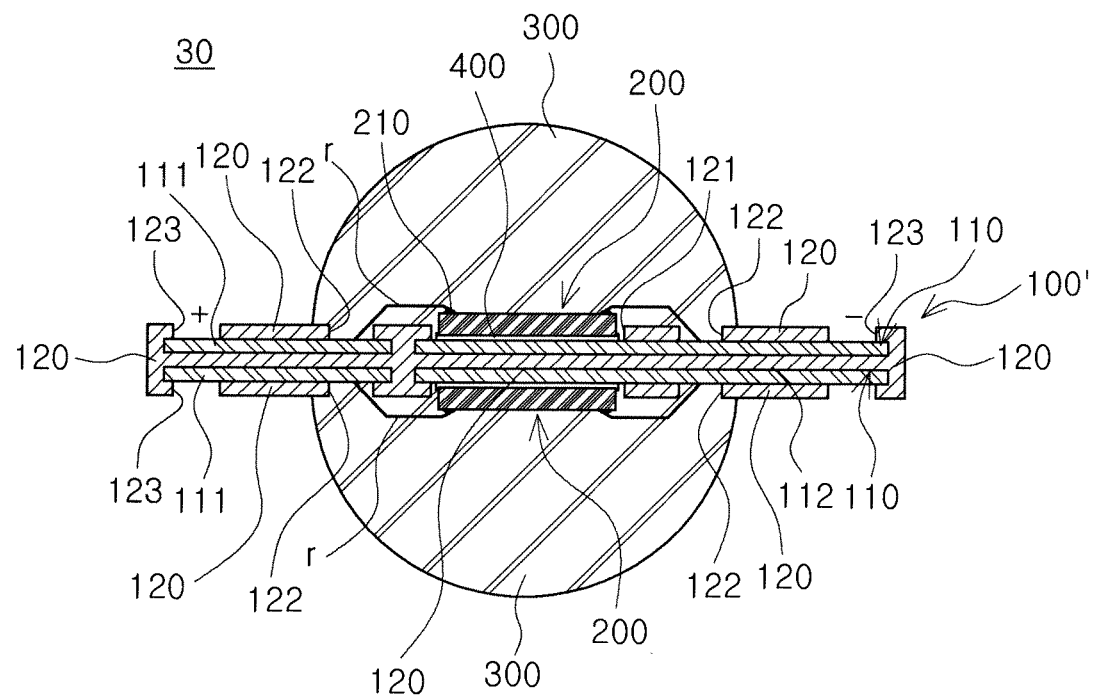
FIGS. 14A and 14B are views schematically illustrating a light source module according to another embodiment of the present inventive concept.
Figure 14B:
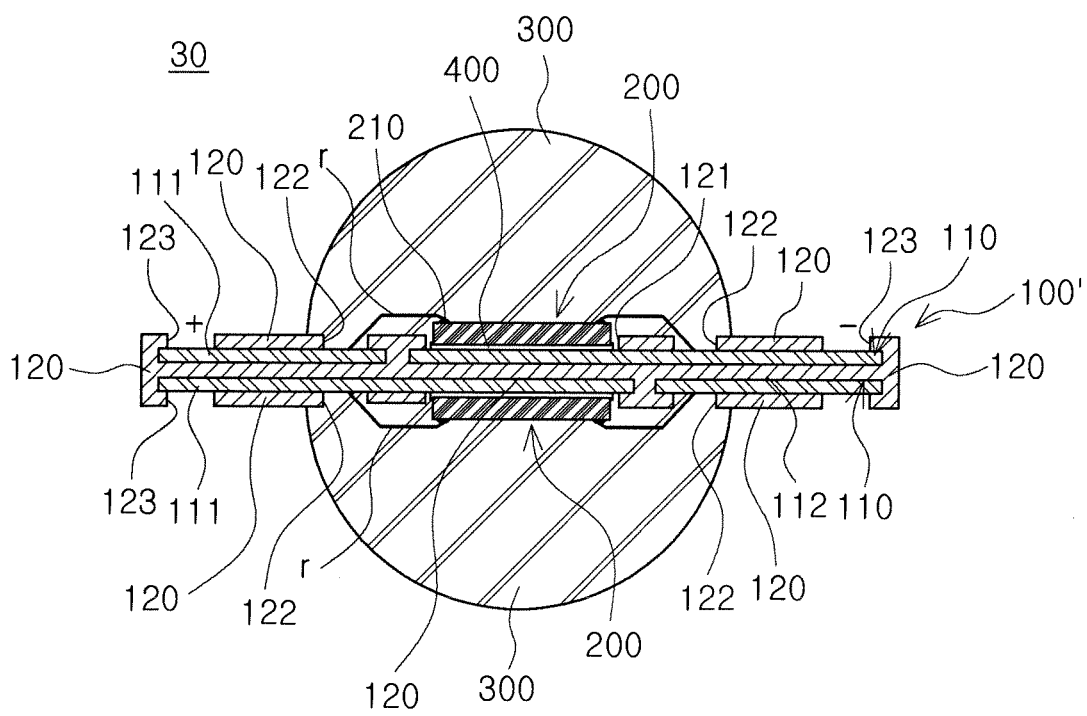

The basic structure of the light source module according to the embodiment shown in FIGS. 14A and 14B is substantially identical to that of the light source module according to the embodiment shown in FIGS. 8 through 13B, except for different structural features of a substrate 100'. Accordingly, a repeated description thereof will be omitted and the different structural features of the substrate 100' will primarily be described in detail.

FIGS. 14A and 14B are views schematically illustrating a light source module according to another embodiment of the present inventive concept.

As shown in FIGS. 14A and 14B, the substrate 100' includes the core plate 110 having the light emitting devices 200 fixedly attached to both surfaces thereof, and the insulating layer 120 covering the core plate 110.

Here, at least one pair of core plates 110 are provided within the insulating layer 120 and are stacked on each other, while having a predetermined interval therebetween due to the insulating layer 120.

Specifically, the at least one pair of core plates 110, each including the divided members 111 and 112 (or a plurality of divided members), are stacked in a multilayer structure. The insulating layer 120 is disposed between the at least one pair of core plates 110 to allow the at least one pair of core plates 110 to be insulated from each other.

As shown in FIG. 14A, the divided members 111 and 112 forming each core plate 110 may have a symmetrical structure. Alternatively, as shown in FIG. 14B, the divided members 111 and 112 may have an asymmetrical structure.

The light emitting devices 200 mounted on the upper and lower surfaces of the substrate 100' are substantially mounted on the separate core plates 110, such that the light emitting devices 200 may be independently controlled.

A light source module according to another embodiment of the present inventive concept will be described with reference to FIGS. 15A and 15B.

Figure 15A:
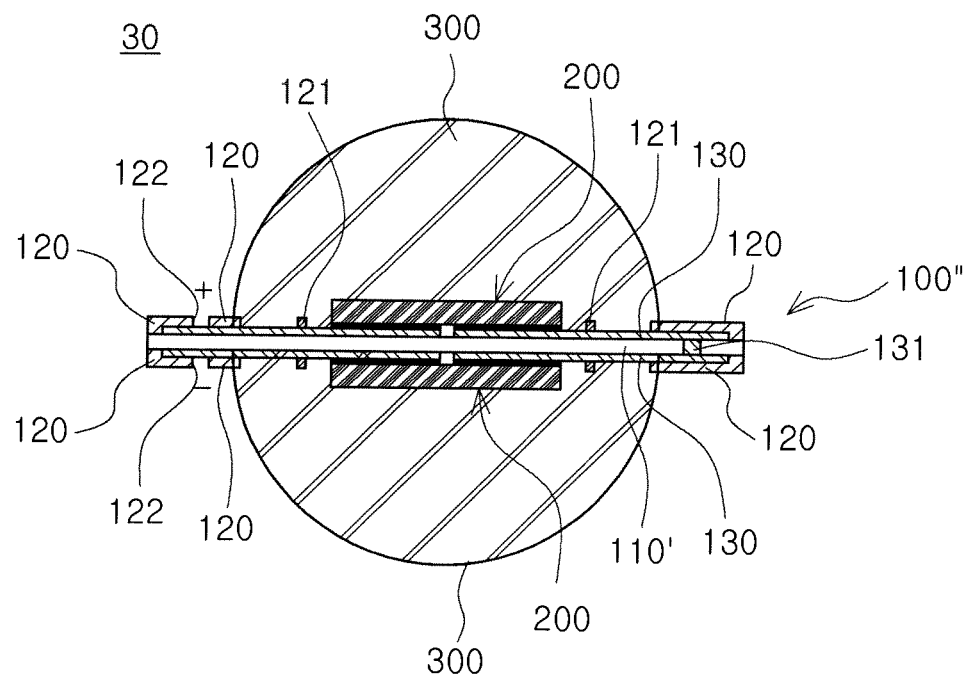
FIGS. 15A and 15B are views schematically illustrating a light source module according to another embodiment of the present inventive concept.
Figure 15B:
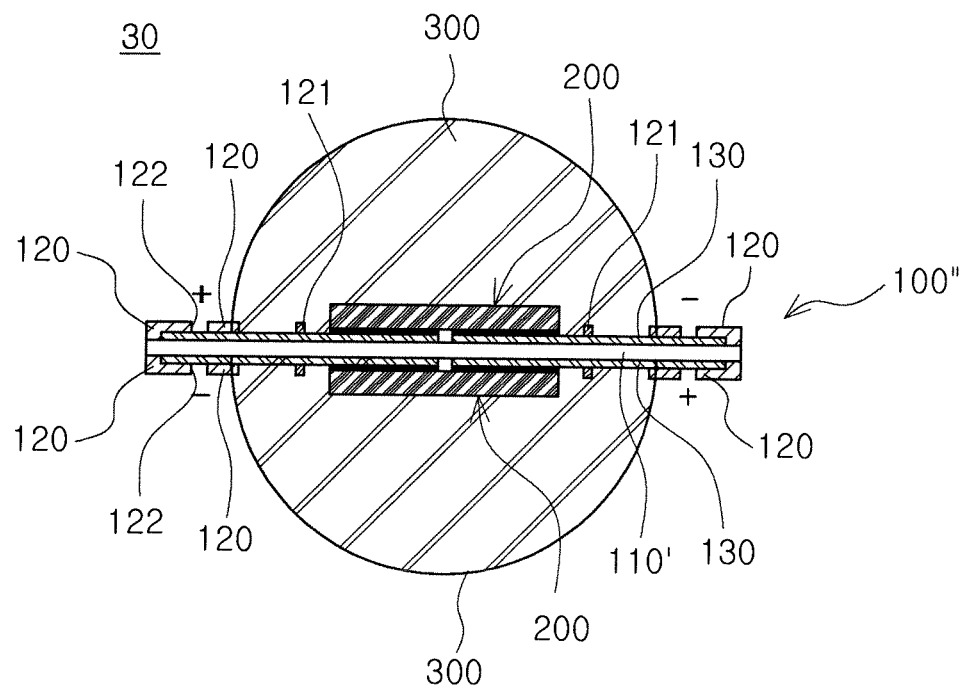

The basic structure of the light source module according to the embodiment shown in FIGS. 15A and 15B is substantially identical to that of the light source module according to the embodiments shown in FIGS. 8 through 14B, except for different structural features of a substrate 100". Accordingly, a repeated description thereof will be omitted and the different structural features of the substrate will primarily be described in detail.

FIGS. 15A and 15B are views schematically illustrating a light source module according to another embodiment of the present inventive concept.

As shown in FIGS. 15A and 15B, the substrate 100" includes a core plate 110' having the light emitting devices 200 fixedly attached to both surfaces thereof, electrode layers 130 electrically connected to the light emitting devices 200, and the insulating layer 120 covering the core plate 110' and the electrode layers 130.

The core plate 110' may be formed of a non-conductive material having light transmittance. For example, an organic/inorganic transparent polymer film having high heat resistance or a glass material may be used therefor. The core plate 110' is provided as a single member in FIGS. 15A and 15B; however, the present inventive concept is not limited thereto. The core plate 110' may include a plurality of divided members.

At least one pair of electrode layers 130 may be formed on both surfaces of the core plate 110', respectively, such that the pair of electrode layers 130 may be electrically connected to the light emitting devices 200. The electrode layers 130 may be transparent electrode layers formed of at least one of ITO, carbon nanotubes (CNTs), graphene or the like.

The insulating layer 120 is formed on both surfaces of the core plate 110' to cover and protect and electrically insulate the core plate 110' and the electrode layers 130. The insulating layer 120 may have light transmittance, like the electrode layers 130.

The insulating layer 120 may have openings 121 and 122 exposing portions of the electrode layers 130 in order to connect the light emitting devices 200 and an external light source (not separately shown) to the electrode layers 130. The openings 121 and 122 may include a region for mounting the light emitting devices 200 on the core plate 110' and a region for electrically connecting the core plate 110' to the external power source, namely, the power supply unit 11, respectively.

As illustrated in FIGS. 15A and 15B, the light emitting devices 200 may have the electrode pads 210 (see FIGS. 14A and 14B) on lower surfaces thereof in contact with the core plate 110'. The opening 121 defining the region for mounting the light emitting device 200 on the core plate 110' may have a shape corresponding to a shape of the light emitting device 200. The electrode layers 130 are exposed through the opening 121. The light emitting devices 200 are attached to the electrode layers 130 extended inwardly of the opening 121 and exposed through the opening 121 using the conductive adhesive 400 (see FIGS. 14A and 14B), such that the light emitting devices 200 and the electrode layers 130 are electrically connected to each other.

In another embodiment, the opening 121 allowing for the mounting of the light emitting devices 200 on the electrode layers 130 may be omitted. That is, the light emitting devices 200 may be mounted on the insulating layer 120 without the opening 121. In this case, the electrode pads may be provided on the upper surfaces of the light emitting devices 200, not the lower surfaces thereof, and the light emitting devices 200 may be electrically connected to the electrode layers 130 via the bonding wire r (see FIGS. 14A and 14B).

As shown in FIG. 15A, the opening 122 defining the region for electrically connecting the core plate 110' to the external power source may be formed in the insulating layer 120 on one end portion of the core plate 110'. A conductive via 131 may be provided to penetrate the other end portion of the core plate 110' to thereby allow the electrode layers 130 provided on both surfaces of the core plate 110' to be connected to each other. Accordingly, the light emitting devices 200 mounted on both surfaces of the core plate 110' are connected in series.

Meanwhile, as shown in FIG. 15B, the opening 122 defining the region for electrically connecting the core plate 110' to the external power source may be formed in the insulating layer 120 on both surfaces of the core plate 110'. Therefore, the light emitting devices 200 respectively mounted on both surfaces of the core plate 110' are electrically connected to the separate electrode layers, thereby being independently controlled.

A light source module according to another embodiment of the present inventive concept will be described with reference to FIGS. 16A through 16C.

Figure 16A:
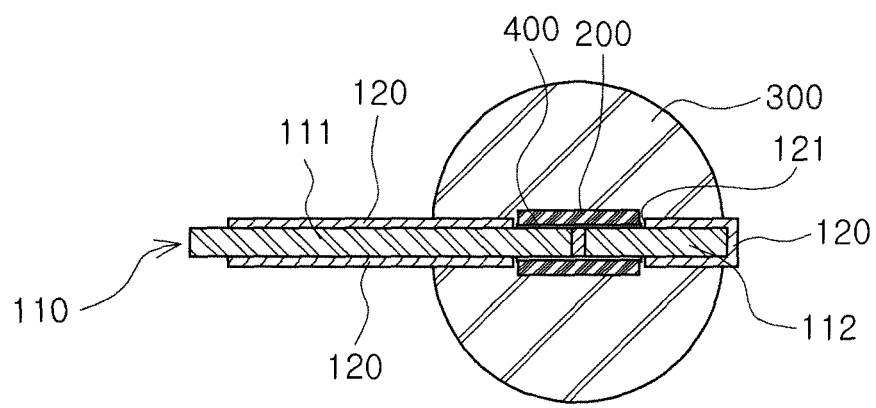
FIGS. 16A through 16C are views schematically illustrating a light source module according to another embodiment of the present inventive concept.
Figure 16B:
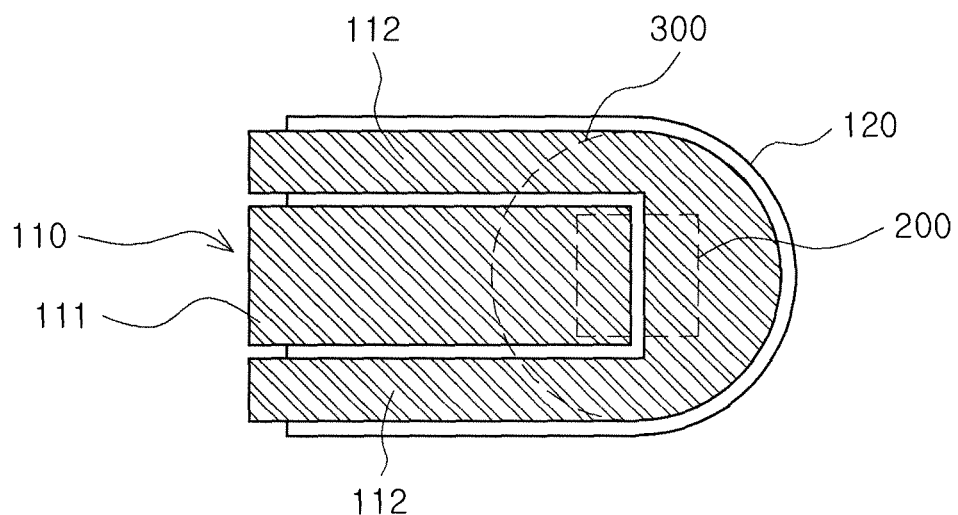
Figure 16C:
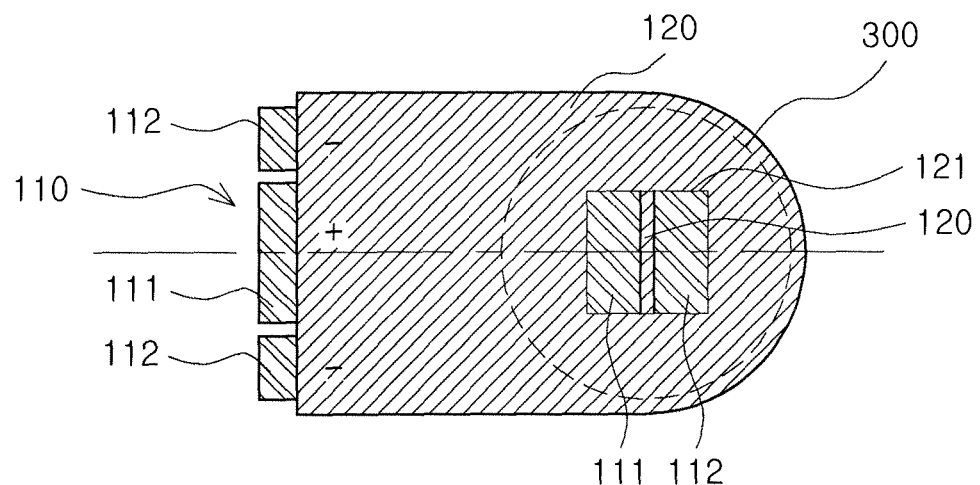

The basic structure of the light source module according to the embodiment shown in FIGS. 16A through 16C is substantially identical to the basic structure of the light source module according to the embodiments shown in FIGS. 8 through 15B, except that the light emitting devices 200 are mounted in a different manner. Accordingly, a repeated description thereof will be omitted and the different mounting structure of the light emitting devices will primarily be described in detail.

FIGS. 16A through 16C are views schematically illustrating a light source module according to another embodiment of the present inventive concept.

As shown in FIGS. 16A through 16C, the light source module 30 may include the substrate 100 (see FIGS. 10A and 10B), a plurality of light emitting devices 200 respectively mounted on both surfaces of the substrate 100, and the lens unit 300 covering the light emitting devices 200.

The substrate 100 includes the core plate 110 having the light emitting devices 200 fixedly attached to both surfaces thereof, and the insulating layer 120 covering the core plate 110. The core plate 110 may be formed of a metal and a metal compound having electrical conductivity as described in FIGS. 8 through 14B, or may be formed of a non-conductive material having light transmittance as described in FIGS. 15A and 15B. In this embodiment, the light source module will be described with reference to the embodiment of FIG. 13.

As shown in FIGS. 16A through 16C, the core plate 110 may include the plurality of divided members 111 and 112. The divided members 111 and 112 are connected to the positive (+) and negative (−) electrodes, respectively. The light emitting devices 200 may be disposed on both surfaces of the core plate 110 while making a connection between the two divided members 111 and 112. In this case, the light emitting devices 200 may be mounted on one end portion of the core plate 110, not on a central portion thereof.

The insulating layer 120 may have the opening 121 for mounting the light emitting devices 200 on the core plate 110 in a region in which the divided members 111 and 112 of the core plate 110 face each other. The light emitting devices 200 are attached to the divided members 111 and 112 extended inwardly of the opening 121 and exposed through the opening 121 using the conductive adhesive 400, such that the light emitting devices 200 and the divided members are electrically connected to each other. The conductive adhesive 400 may include a solder bump (not separately shown).

As illustrated in FIGS. 16B and 16C, the end portion of the core plate adjacent to the light emitting devices 200 may be formed as a curved surface having a curvature corresponding to the curvature of the lens unit 300. The other end portion of the core plate 110 may be protruded from the insulating layer 120 and exposed outwardly. Therefore, the substrate 100 may be directly mounted on the main body unit 10 (see FIGS. 1, 2 and 6) through the protruded core plate 110.

As set forth above, according to embodiments of the present inventive concept, although a light emitting device itself is used as a light source, even a lateral area and a rear area, in addition to a front area, can be simultaneously illuminated through radiated light, thus markedly improving light distribution characteristics.

While the present inventive concept has been shown and described in connection with the embodiments, it will be apparent to those skilled in the art that modifications and variations can be made without departing from the spirit and scope of the inventive concept as defined by the appended claims.

What is claimed is:

1. An illumination device, comprising:
a main body unit;
a light source module disposed in an upper space of the main body unit to be separated therefrom and including a substrate and at least one light emitting device respectively disposed on both surfaces of the substrate;
a cover unit disposed on the main body unit to cover the light source module and allowing light emitted from the light source module to be emitted from a surface of the cover unit in a radial manner; and
a plurality of support units disposed on the main body unit and directly connected with the main body unit and the substrate, and supporting the light source module disposed in the upper space of the main body unit,
wherein the at least one light emitting device is positioned between the plurality of support units.

2. The illumination device of claim 1, wherein the plurality of support units include a body having a pillar shape, and the body has a sectional area smaller than a sectional area of the main body unit.

3. The illumination device of claim 2, wherein:
the body includes a material having high thermal conductivity, and
the body has an inner hole formed therein, the inner hole accommodating an electric wire electrically connected to the light source module.

4. The illumination device of claim 2, wherein the plurality of support units further include a reflective layer disposed on an outer surface of the body.

5. The illumination device of claim 1, wherein the plurality of support units form a space accommodating the at least one light emitting device disposed on one surface of the substrate facing the main body unit.

6. The illumination device of claim 1, wherein the plurality of support units allow power to be supplied from the main body unit connected to an external power source to the light source module.

7. The illumination device of claim 1, further comprising a reflective unit disposed on the main body unit between the main body unit and the light source module and reflecting the light emitted from the light source module toward the main body unit.

8. The illumination device of claim 7, wherein the reflective unit protrudes from a central portion thereof and includes a reflective surface facing the light source module.

9. The illumination device of claim 1, wherein the substrate includes:
a core plate having the at least one light emitting device fixedly attached thereto; and
an insulating layer covering the core plate.

10. The illumination device of claim 9, wherein the core plate includes a plurality of divided members having electrical conductivity and insulated from each other by the insulating layer.

11. The illumination device of claim 9, wherein the insulating layer includes an opening exposing a portion of the core plate for connecting the core plate to the at least one light emitting device.

12. The illumination device of claim 1, further comprising a reflective unit disposed on the main body unit and including a protruding portion which is lower than a position of the light emitting device,
wherein the reflective unit is separated from the at least one light emitting device.

13. An illumination device, comprising:
a main body unit;
a light source module disposed in an upper space of the main body unit to be separated therefrom and including a substrate and at least one light emitting device respectively disposed on both surfaces of the substrate;
a cover unit disposed on the main body unit to cover the light source module and allowing light emitted from the light source module to be emitted from a surface of the cover unit in a radial manner; and
a reflective unit disposed on the main body unit between the main body unit and the light source module and reflecting the light emitted from the light source module toward the main body unit,
wherein the reflective unit protrudes from a central portion thereof and includes a reflective surface facing the light source module, and
the reflective unit further includes a plurality of through holes allowing the light emitted from the light source module to pass therethrough.

14. The illumination device of claim 13, wherein the plurality of through holes are formed in a region between a periphery of the reflective unit and a region in which the light emitted from the light source module traverses an upper edge of the main body unit.

15. An illumination device, comprising:
a main body unit;
a light source module disposed in an upper space of the main body unit to be separated therefrom and including a substrate and at least one light emitting device respectively disposed on both surfaces of the substrate; and
a cover unit disposed on the main body unit to cover the light source module and allowing light emitted from the light source module to be emitted from a surface of the cover unit in a radial manner,
wherein the substrate includes:
a core plate having the at least one light emitting device fixedly attached thereto; and
an insulating layer covering the core plate, and
the core plate comprises a pair of core plates disposed within the insulating layer and stacked on each other, while having a predetermined interval therebetween due to the insulating layer.

16. An illumination device, comprising:
a main body unit;
a light source module disposed in an upper space of the main body unit to be separated therefrom and including a substrate and at least one light emitting device respectively disposed on both surfaces of the substrate; and
a cover unit disposed on the main body unit to cover the light source module and allowing light emitted from the light source module to be emitted from a surface of the cover unit in a radial manner,
wherein the substrate includes:
a core plate having the at least one light emitting device fixedly attached thereto; and an insulating layer covering the core plate,
the core plate includes a non-conductive material having light transmittance, and
the core plate has an electrode layer on both surfaces thereof, the electrode layer being disposed between the core plate and the insulating layer and electrically connected to the at least one light emitting device.

17. The illumination device of claim 16, wherein:
the electrode layer comprises a transparent electrode layer formed of at least one of ITO, carbon nanotubes (CNTs), and graphene, and
at least one pair of electrode layers are disposed on the both surfaces of the core plate.

18. The illumination device of claim 16, wherein the insulating layer includes an opening exposing a portion of the electrode layer for connecting the electrode layer to the at least one light emitting device.

19. An illumination device, comprising:
a main body unit;
a light source module disposed in an upper space of the main body unit and including a substrate and at least one light emitting device respectively disposed on both surfaces of the substrate;
a reflective unit disposed on the main body unit between the main body unit and the light source module and reflecting the light emitted from the light source module toward the main body unit; and
a plurality of support units disposed on the main body unit and directly connected with the main body unit and the substrate, and supporting the light source module disposed in the upper space of the main body unit,
wherein the at least one light emitting device is positioned between two of the support units.

20. The illumination device of claim 19, further comprising a cover unit disposed on the main body unit to cover the light source module and allowing light emitted from the light source module to be emitted from a surface of the cover unit in a radial manner.

* * * * *